United States Patent
Chen et al.

(10) Patent No.: US 8,072,800 B2
(45) Date of Patent: Dec. 6, 2011

(54) MAGNETIC ELEMENT HAVING PERPENDICULAR ANISOTROPY WITH ENHANCED EFFICIENCY

(75) Inventors: Eugene Youjun Chen, Fremont, CA (US); Shengyuan Wang, Fremont, CA (US)

(73) Assignee: Grandis Inc., Milpitas, CA (US)

( * ) Notice: Subject to any disclaimer, the term of this patent is extended or adjusted under 35 U.S.C. 154(b) by 45 days.

(21) Appl. No.: 12/560,362

(22) Filed: Sep. 15, 2009

(65) Prior Publication Data

US 2011/0064969 A1    Mar. 17, 2011

(51) Int. Cl.
G11B 5/39    (2006.01)

(52) U.S. Cl. .......... 365/158; 428/811.2; 428/811.5; 360/324.11; 360/324.12

(58) Field of Classification Search .......... None
See application file for complete search history.

(56) References Cited

U.S. PATENT DOCUMENTS

| | | | |
|---|---|---|---|
| 6,303,218 B1 * | 10/2001 | Kamiguchi et al. | 428/332 |
| 6,967,863 B2 | 11/2005 | Huai | |
| 7,596,015 B2 * | 9/2009 | Kitagawa et al. | 365/158 |
| 7,663,197 B2 * | 2/2010 | Nagase et al. | 257/421 |
| 2002/0048128 A1 * | 4/2002 | Kamiguchi et al. | 360/324.1 |
| 2009/0246557 A1 * | 10/2009 | Horng et al. | 428/811.1 |

OTHER PUBLICATIONS

Nakayama et al., "Spin transfer switching in TbCoFe/CoFeB/MgO/CoFeB/TbCoFe magnetic tunnel junctions with perpendicular magnetic anisotropy", Journal of Applied Physics 103, 07A710 (2008).

Kishi et al., "Lower-current and Fast switching of A Perpendicular TMR for High Speed and High density Spin-Transfer-Torque MRAM", IEEE 2008, pp. 309-312.

Yoshikawa et al., "Tunnel Magnetoresistance Over 100% in MgO-Based Magnetic Tunnel Junction Films With Perpendicular Magnetic L10-FePt Electrodes", IEEE Transactions on Magnetics, vol. 44, No. 11, Nov. 2008, pp. 2573-2576.

* cited by examiner

Primary Examiner — Kevin Bernatz
(74) Attorney, Agent, or Firm — Fish & Richardson P.C.

(57) ABSTRACT

Techniques and magnetic devices associated with a magnetic element that includes a fixed layer having a fixed layer magnetization and perpendicular anisotropy, a nonmagnetic spacer layer, and a free layer having a changeable free layer magnetization and perpendicular anisotropy.

46 Claims, 13 Drawing Sheets

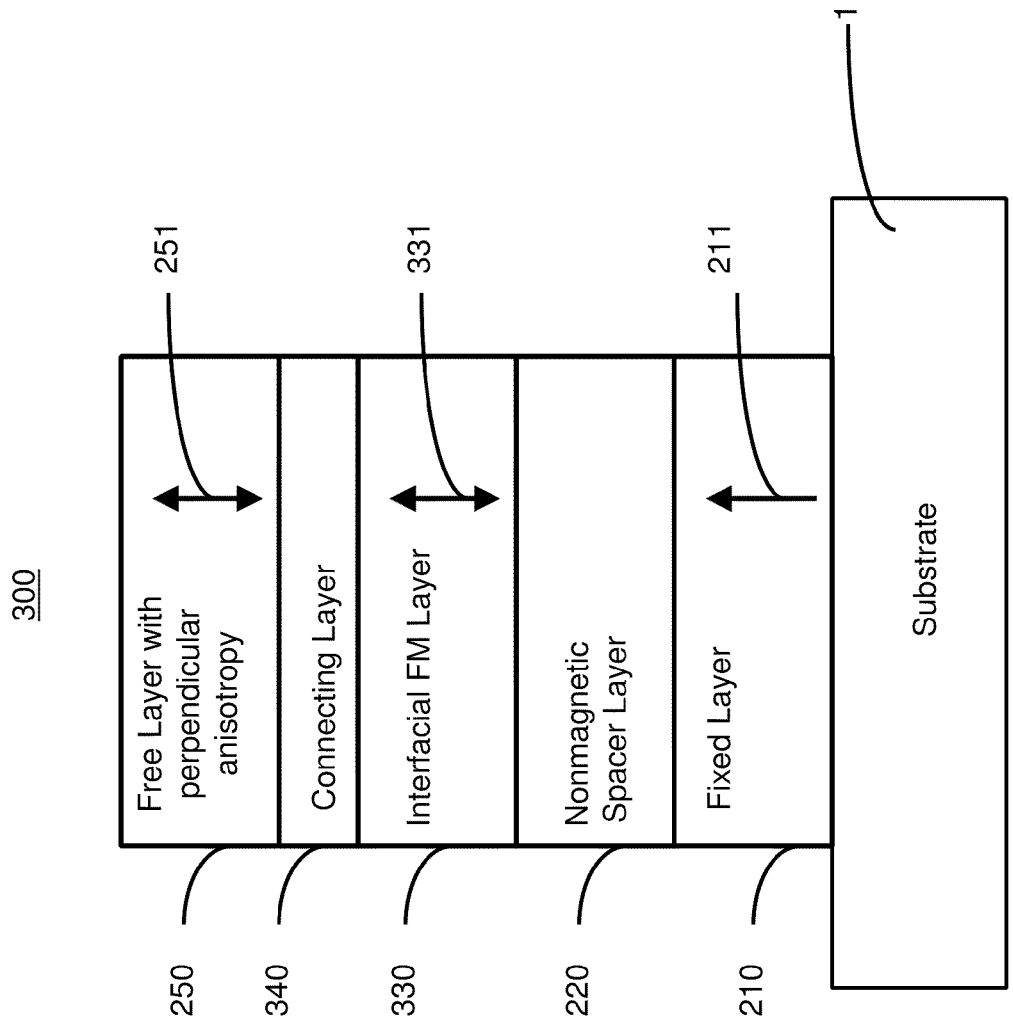

MAGNETIC ELEMENT HAVING PERPENDICULAR ANISOTROPY WITH ENHANCED EFFICIENCY

BACKGROUND

This document relates to magnetic materials and structures having at least one free ferromagnetic layer.

Various magnetic materials use multilayer structures which have at least one ferromagnetic layer configured as a "free" layer whose magnetic direction can be changed by an external magnetic field or a control current. Magnetic memory devices may be constructed using such multilayer structures where information is stored based on the magnetic direction of the free layer.

One example for such a multilayer structure is a spin valve (SV) which includes at least three layers: two ferromagnetic layers and a conducting layer between the two ferromagnetic layers. Another example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. However, when the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer.

Notably, the resistance to the electrical current across the MTJ or SV structures varies with the relative direction of the magnetizations in the two ferromagnetic layers. When the magnetizations of the two ferromagnetic layers are parallel to each other, the resistance across the MTJ or SV structures is at a minimum value RP. When the magnetizations of the two ferromagnetic layers are anti-parallel with each other, the resistance across the MTJ or SV is at a maximum value RAP. The magnitude of this effect is commonly characterized by the tunneling magnetoresistance (TMR) in MTJs or magnetoresistance (MR) in SVs defined as $(R_{AP}-R_P)/R_P$.

SUMMARY

This document discloses techniques, devices and systems that use magnetic elements that include at least a fixed magnetic layer having perpendicular anisotropy, a nonmagnetic spacer layer, and a free magnetic layer having perpendicular anisotropy which promotes magnetization perpendicular to the plane of the magnetic layers. The spacer layer resides between the fixed and free layers. The magnetic element is configured to allow the free layer to be switched using spin transfer when a write current is passed through the magnetic element.

In one aspect, methods and structures are disclosed to provide perpendicular anisotropy in a multilayer magnetic element. In one implementation, a fixed layer is provided to have a fixed layer magnetization fixed in a direction perpendicular to the fixed layer, a nonmagnetic spacer layer is provided over the fixed layer, and a free layer is located relative to the fixed layer and the spacer layer so that the spacer layer is between the free and fixed layer. The free layer has a free layer magnetization that is perpendicular to the free layer and is changeable relative to the fixed layer magnetization. An interfacial layer is in contact with the spacer layer and is a magnetic layer. A connecting layer is in contact with the interfacial layer and the free layer. The connecting layer has a structure providing magnetic coupling between the free layer and the interfacial layer that maintains the magnetization of the interfacial layer to be perpendicular to the interfacial layer and providing a separation between the free layer and the interfacial layer to permit the free layer and the interfacial layer to have different material structures.

The free layer and/or the fixed layer are configured to have perpendicular anisotropy. In certain implementations, the free layer and/or the fixed layer could include ferromagnetic $(Ni, Fe, Co)_{100-y}(Pd, Pt)_y$ where y ranges between twenty and eighty atomic percent, or between fifty and seventy five atomic percent.

In certain implementations, the free layer and/or the fixed layer having perpendicular anisotropy could include ferromagnetic material $(Ni, Fe, Co)_{50}(Pd, Pt)_{50}$ combined with nonmagnetic material(s). In certain implementations the nonmagnetic material(s) could include at least one of Ti, Zr, Hf, V, Nb, Ta, Cr, Mo, W, Pt, Pd, Ir, Rh, Ru, Os, Re, Au, Ag, Cu. In certain implementations the nonmagnetic material(s) could include at least one of B, C, N, O, Al, Si, P, S, Ga, Ge, In, Sn, an oxide, a nitride, or a transition metal. In certain implementations the nonmagnetic material(s) could include at least one Ti, Zr, Hf, V, Nb, Ta, Cr, Mo, W, Pt, Pd, Ir, Rh, Ru, Os, Re, Au, Ag, Cu and at least one of B, C, N, O, Al, Si, P, S, Ga, Ge, In, Sn, an oxide, a nitride, or a transition metal silicide.

In certain implementations, the free layer and/or the fixed layer having perpendicular anisotropy could include ferromagnetic material Ni, Fe, or an alloy of Ni, Fe, and/or Co including at least Ni and/or Fe combined with nonmagnetic material(s). In certain implementations the nonmagnetic material(s) could include at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide.

In certain implementations, the free layer and/or the fixed layer having perpendicular anisotropy could include ferromagnetic material (Ni, Fe, Co) combined with nonmagnetic material(s). In certain implementations the nonmagnetic material(s) could include at least one of Cr, Ta, Nb, V, W, Hf, Ti, Zr, Pt, Pd, Gd, Tb, Dy, Ho, Nd, and at least one of Ti, Zr, Hf, V, Nb, Ta, Cr, Mo, W, Pt, Pd, Ir, Rh, Ru, Os, Re, Au, Ag, Cu. In certain implementations the nonmagnetic material(s) could include at least one of Cr, Ta, Nb, V, W, Hf, Ti, Zr, Pt, Pd, Gd, Tb, Dy, Ho, Nd, and at least one of B, C, N, O, Al, Si, P, S, Ga, Ge, In, Sn, an oxide, a nitride, or a transition metal silicide.

In certain implementations, the free layer and/or the fixed layer having perpendicular anisotropy could include material Mn, and/or including at least Ni, Al, Cr, and/or Fe combined with nonmagnetic material(s). In certain implementations the nonmagnetic material(s) could include at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide.

In certain implementations, the free layer and/or the fixed layer having perpendicular anisotropy could include a multilayer including alternating layers of magnetic material layers and nonmagnetic material layers. In certain implementations the magnetic material layers includes (Ni, Fe, Co) and the nonmagnetic material layers include at least one of Ti, Zr, Hf, V, Nb, Ta, Cr, Mo, W, Pt, Pd, Ir, Rh, Ru, Os, Re, Au, Ag, Cu. In certain implementations the magnetic material layers includes (Ni, Fe, Co) and the nonmagnetic material layers include at least one of B, C, N, O, Al, Si, P, S, Ga, Ge, In, Sn, an oxide, a nitride, or a transition metal silicide. In certain implementations the magnetic material layers includes (Ni, Fe, Co)$_{50}$(Pd, Pt)$_{50}$ and the nonmagnetic material layers include at least one of Cr, Pt, Pt, Pd, Ir, Rh, Ru, Os, Re, Au, Cu. In certain implementations the magnetic material layers includes (Ni, Fe, Co) combined with at least one of Cr, Pt, Pd, Ir, Rh, Ru, Os, Re, Au, Cu. In certain implementations the magnetic material layers includes (Ni, Fe, Co) combined with at least one of Cr, Ta, Nb, V, W, Hf, Ti, Zr, Pt, Pd and the nonmagnetic material layers include at least one of Cr, Pt, Pt, Pd, Ir, Rh, Ru, Os, Re, Au, Cu. In certain implementations the magnetic material layers includes (Ni, Fe, Co) combined with at least one of B, C, N, O, Al, Si, P, S, Ga, Ge, In, Sn and the nonmagnetic material layers include at least one of Cr, Pt, Pt, Pd, Ir, Rh, Ru, Os, Re, Au, Cu. In certain implementations the magnetic material layers includes (Ni, Fe, Co) combined with at least one of Cr, Ta, Nb, V, W, Hf, Ti, Zr, Pt, Pd and the nonmagnetic material layers include at least one of B, C, N, O, Al, Si, P, S, Ga, Ge, In, Sn, an oxide, a nitride, or a transition metal silicide.

In another aspect, a device is provided to include a magnetic element array including a substrate and magnetic elements formed on the substrate. Each magnetic element includes a fixed layer having a fixed layer magnetization fixed in a direction perpendicular to the fixed layer, a nonmagnetic spacer layer over the fixed layer, an interfacial layer in contact with the spacer layer and being a magnetic layer, a connecting layer in contact with the interfacial layer, and a free layer in contact with the connecting layer and having a free layer magnetization that is perpendicular to the free layer and is changeable relative to the fixed layer magnetization based on spin torque transfer. The connecting layer has a structure providing magnetic coupling between the free layer and the interfacial layer that maintains the magnetization of the interfacial layer to be perpendicular to the interfacial layer and providing a separation between the free layer and the interfacial layer to permit the free layer and the interfacial layer to have different material structures. This device includes a circuit that is coupled to the magnetic element array and supplies a current to flow through layers of each magnetic element in a direction perpendicular to the layers to switch the magnetization of the free layer based on spin torque transfer between two magnetization directions.

These and other implementations are described in greater detail in the drawings, the description and the claims.

BRIEF DESCRIPTION OF THE DRAWINGS

FIGS. 4A, 4B and 4C show two examples of magnetic elements having a perpendicular anisotropy based on interfacial and connecting layers.

DETAILED DESCRIPTION

Multilayered magnetic elements with a free layer and a fixed layer separated by a nonmagnetic spacer, when grown monolithically on a substrate, require certain material properties of adjacent layers to be compatible or match, e.g., match of lattice structures. This can limit the choice of materials suitable for forming such structures and thus affect the properties of the constructed magnetic elements. Examples of multilayered magnetic elements described in this document have a magnetization perpendicular to the free and fixed layers and include additional layers between at the free layer and the spacer layer to engineer desired properties of the magnetic elements, e.g., increasing the TMR ratio, achieving a high STT efficiency and reducing the damping constant.

The following sections first describe structures of magnetic elements and then provide examples of magnetic elements with a perpendicular magnetization and the additional layers for engineering the magnetic elements.

Figure 1A:
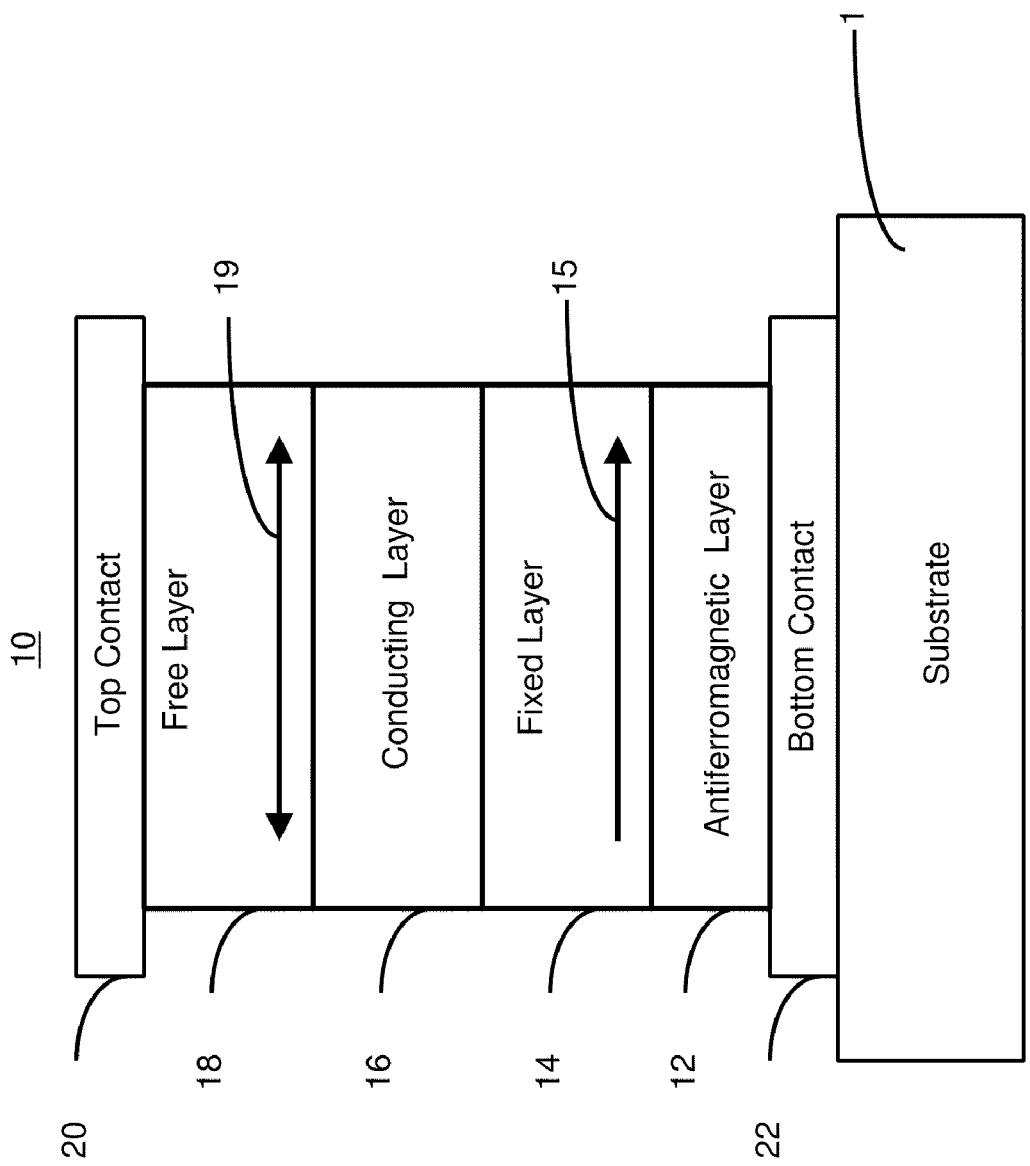
FIG. 1A shows an example of a magnetic element in the form a spin valve.
Figure 1B:
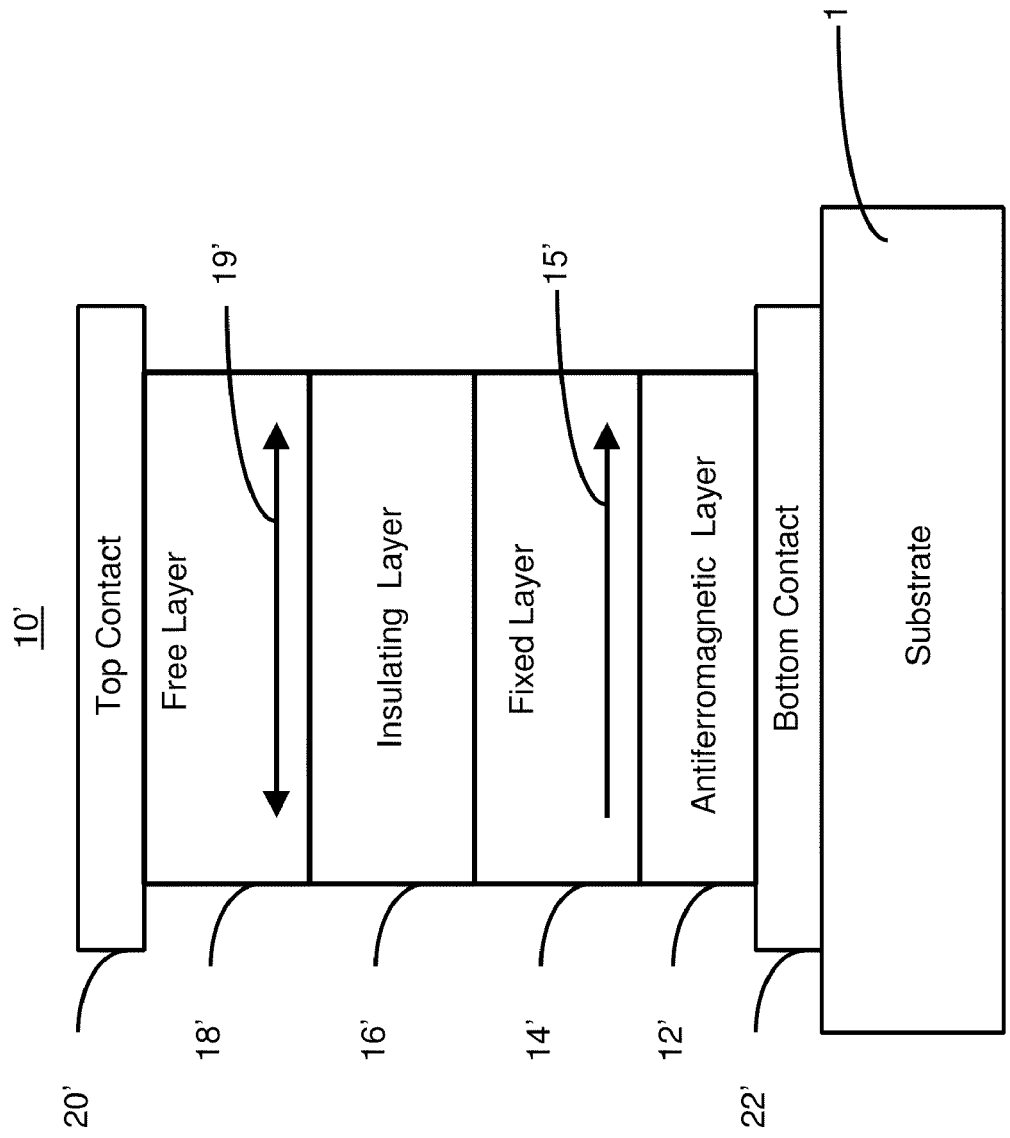
FIG. 1B shows an example of a magnetic element in the form of a spin tunneling junction.

FIGS. 1A and 1B depict exemplary magnetic elements 10 and 10' formed on a substrate 1. The magnetic element 10 is a spin valve and includes an antiferromagnetic (AFM) layer 12, a fixed layer 14, a conductive spacer layer 16 and a free layer 18. Other layers, such as seed or capping layer can also be used. The fixed layer 14 and the free layer 18 are ferromagnetic. The free layer 18 is depicted as having a changeable magnetization 19. The magnetization of the free layer 18 is free to rotate, in response to an external magnetic field, a driving electric current, or a combination of both. The conductive spacer layer 16 is nonmagnetic. The AFM layer 12 is used to pin the magnetization of the fixed layer 14 in a particular direction. After post annealing, the ferromagnetic layer 14 is pinned with a fixed magnetization 15. Also depicted are top contact 20 and bottom contact 22 that can be used to drive current through the magnetic element 10.

The magnetic element 10' depicted in FIG. 1B is a magnetic tunneling junction. The magnetic element 10' includes an AFM layer 12', a fixed layer 14' having a fixed layer magnetization 15', an insulating barrier layer 16', a free layer 18' having a changeable magnetization 19'. The barrier layer 16' is thin enough for electrons to tunnel through in a magnetic tunneling junction 10'.

The relationship between the resistance to the current flowing across the MTJ or SV and the relative magnetic direction between the two ferromagnetic layers in the TMR or MR effect can be used for nonvolatile magnetic memory devices to store information in the magnetic state of the magnetic element. Magnetic random access memory (MRAM) devices based on the TMR or MR effect, for example, can be an alternative of and compete with electronic RAM devices. In such devices, one ferromagnetic layer is configured to have a fixed magnetic direction and the other ferromagnetic layer is a "free" layer whose magnetic direction can be changed to be either parallel or opposite to the fixed direction and thus operate as a recording layer. Information is stored based on the relative magnetic direction of the two ferromagnetic layers on two sides of the barrier of the MTJ or SV. For example, binary bits "1" and "0" can be recorded as the parallel and anti-parallel orientations of the two ferromagnetic layers in the MTJ or SV. Recording or writing a bit in the MTJ or SV can be achieved by switching the magnetization direction of the free layer, e.g., by a writing magnetic field generated by supplying currents to write lines disposed in a cross stripe shape, by a current flowing across the MTJ or SV based on the spin transfer effect, by a combination of applying both a writing magnetic field and a current, or by other means.

Magnetic random access memory devices utilizing a spin transfer effect in switching can be operated under a low switching current density, $J_c$, below $10^7$ A/cm$^2$ (e.g., around or below $10^6$ A/cm$^2$) for practical device applications. This low switching current density advantageously allows for formation of densely packed memory cells (e.g., sub-micron lateral dimensions) with a high bias current. The reduction of spin-transfer switching current density $J_c$ can be critical for making MRAM devices featured by a fast operation speed, low power consumption, and a high spatial density of memory cells. With decreased technology node of memory devices, however, thermal stability decreases and increasingly affects the performance of these devices. During periods of latency when an MTJ preserves a stored datum, the magnetization in the free layer is not entirely static and may change due to thermal fluctuations that allow the magnetic moments within the free layer to oscillate or precess. The random nature of these fluctuations allows the occurrence of rare, unusually large fluctuations that may result in the reversal of the free-layer magnetization.

Magnetic materials with perpendicular anisotropy can be used to provide increased thermal stability in magnetic devices, including spin transfer magnetic devices. In these devices, the thermal activation factor depends on the volume and perpendicular magnetic anisotropy of the free layer of a magnetic element and the thermal stability decreases as the volume of the magnetic element reduces. The large perpendicular anisotropy can compensate for the reduced thermal stability due to the decrease in volume associated with the decreasing device size. In addition, for spin transfer devices utilizing perpendicular anisotropy, the in-plane shape anisotropy is no longer required in the device design. Accordingly, the device shape can be circular instead of an elongated shape to improve the memory device areal density.

Based on a spin transfer model, the switching current density can be expressed for the films having out-of-plane or perpendicular dominant anisotropy in the absence of external field as:

$$J_c \propto \alpha M_s t(H_\perp - 4\pi Ms)/\eta$$

where $\alpha$ is the phenomenological Gilbert damping, t and $M_s$ are the thickness and saturation magnetization of the free layer, respectively. $H_\perp$ is intrinsic perpendicular uniaxial anisotropy field which could be resulted from interfacial (or surface) anisotropy and/or effect of magneto-elastic energy. $\eta$ corresponds to an efficiency of spin transfer switching. $4\pi Ms$ comes from demagnetization field perpendicular to the film plane.

The absolute value of $H_\perp$ is generally larger than that of $2\pi Ms$ for the case of the film having out-of-plane perpendicular anisotropy. Therefore, the term of $(H_\perp - 4\pi Ms)$ and the associated switching current density Jc, can be reduced through optimization of $H_\perp$ of the free layer in the case of the films having perpendicular anisotropy. In addition, a reduction of magnetization Ms of the free layer can be used to reduce the switching current density Jc.

The examples of magnetic devices based on a magnetic element having perpendicular magnetization layers can be switched with the spin transfer effect. The small spin-transfer switching current and high read signal can be achieved by using the perpendicular magnetization in spin valve and magnetic tunnel junction films.

Figure 2A:
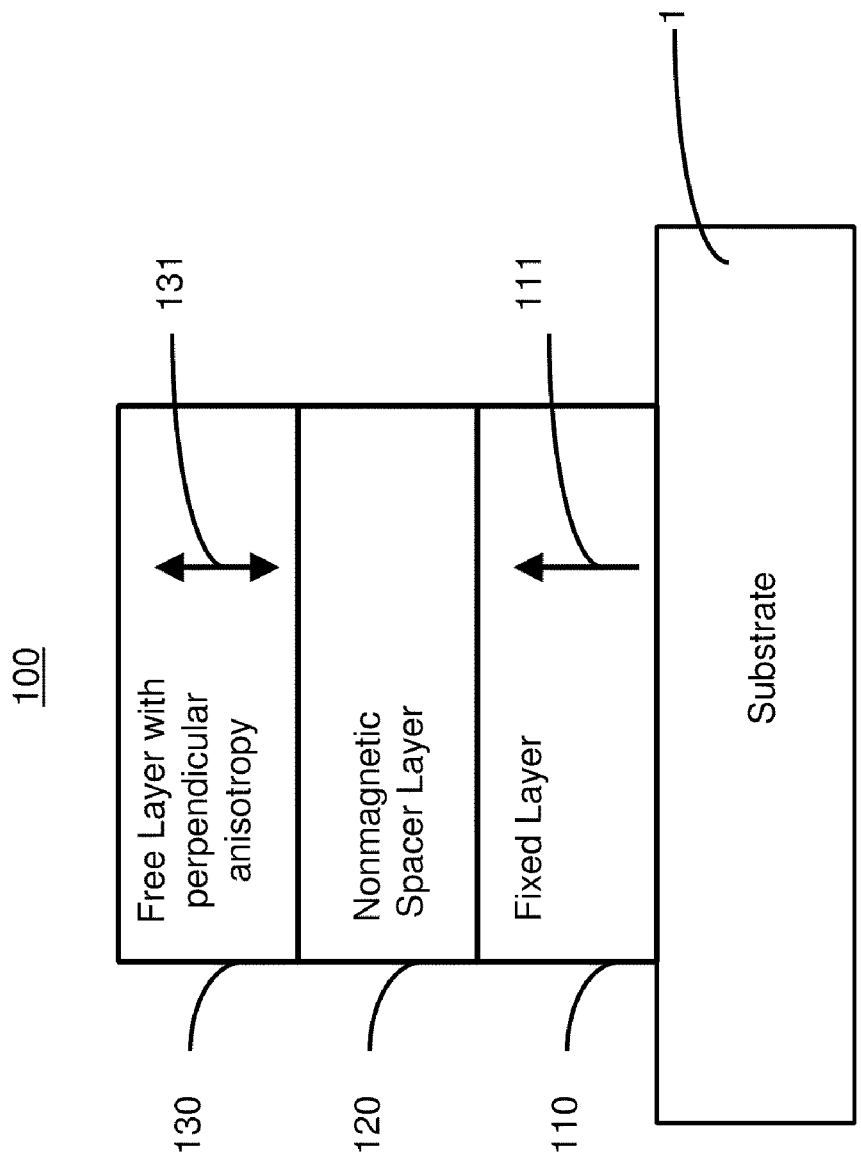
FIGS. 2A and 2B depict examples of two magnetic elements having perpendicular anisotropy with fixed layer below and above the nonmagnetic spacer.

FIG. 2A depicts one implementation of a magnetic element 100 on a substrate 1. This magnetic element 100 includes a free layer 130 on the top and a fixed layer 110 on the bottom, both with perpendicular anisotropy. A nonmagnetic spacer layer 120 is formed between the layers 110 and 130. The fixed layer 110 has a fixed layer magnetization 111 perpendicular to the fixed layer 110, and the free layer 130 has a reversible free layer magnetization 131 perpendicular to the free layer 130. The free layer magnetization 131 can be written using the spin transfer effect. In this example, the fixed layer 110 is under nonmagnetic spacer layer 120 and above the substrate 1 and the free layer 130 is above the nonmagnetic spacer layer 120. Fixed layer 110 and/or free layer 130 can include magnetic materials multilayered with nonmagnetic or oxide layers, in which the magnetic sublayers can be antiferro-magnetically or ferro-magnetically coupled. Nonmagnetic spacer layer 120 can include insulating layers such as $Al_2O_3$, MgO, TiO, TaO, and other oxides. Nonmagnetic spacer layer 120 can include conducting layers such as Cu. An antiferromagnetic layer can be included to pin the magnetization of the fixed layer magnetization 111 in a desired direction after post annealing.

Figure 2B:
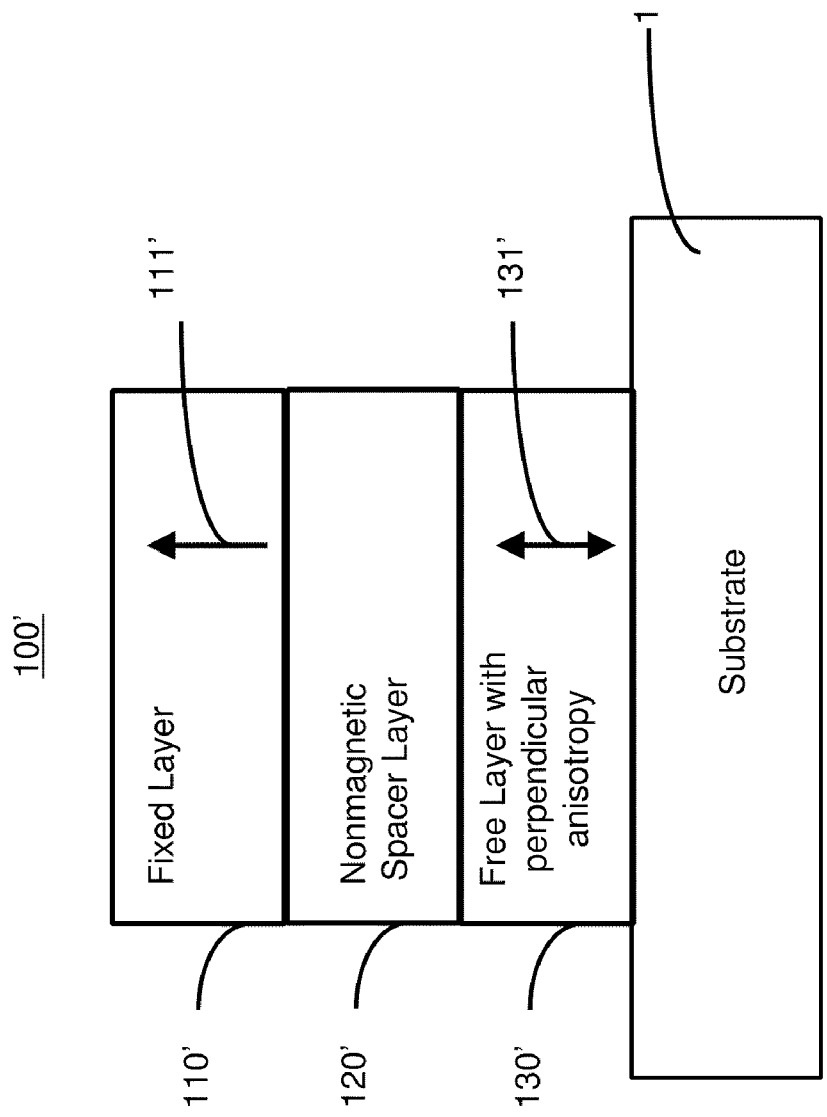

FIG. 2B depicts another implementation of a magnetic element 100' on a substrate 1 having a free layer and a fixed layer, both with perpendicular anisotropy. The magnetic element 100' includes a fixed layer 110' having a fixed layer magnetization 111', a nonmagnetic spacer layer 120', and a free layer 130' with magnetization 131' that can be written using spin transfer. The fixed layer 110' is above nonmagnetic spacer layer 120' and the free layer 130' is under the nonmagnetic spacer layer 120' and above the substrate 1. Fixed layer 110' and/or free layer 130' can include magnetic materials multilayered with nonmagnetic or oxide layers, in which the magnetic sublayers can be antiferro-magnetically or ferro-magnetically coupled. Nonmagnetic spacer layer 120 can include insulating layers such as $Al_2O_3$, MgO, TiO, TaO, and other oxides. Nonmagnetic spacer layer 120' can include conducting layers such as Cu. An antiferromagnetic layer can be included to pin the magnetization of the fixed layer magnetization 111 in a desired direction after post annealing.

A capping layer can be included above free layer 130 in FIG. 2A and the fixed layer 110' in FIG. 2B. Also, a seed layer can be included between the fixed layer 110 and the substrate 1 in FIG. 2A and between the free layer 130' and the substrate 1 in FIG. 2B. Both the capping layer and seed layer can be a single layer or multilayer in structure, crystalline or amorphous in state, metal or oxide, magnetic or non-magnetic, either with in-plane or with perpendicular anisotropy. The capping layer and/or seed layer can be at least one of Ti, Zr, Hf, V, Nb, Ta, Cr, Mo, W, Pt, Pd, Ir, Rh, Ru, Os, Re, Au, Ag, Cu; or B, C, N, O, Al, Si, P, S or their alloying, or oxide, nitride or silicide with transition metal, such as AlMg, CrTi, CrMo, CrRu, NiAl, NiP, NiFeCr, MgO, TaO, TiO, AlO, SiO, CuAlO, TiN, TaN, CuN, FeSi, CoO, NiO. The capping layer and/or seed layer can improve texture for perpendicular properties, improve interfacial properties for stack growth and tunneling magnetoresistance, act as a stop layer for interdiffusion, provide protection cover or coating for stack stability, and/or shield the magnetic layers from stray magnetic fields.

In FIG. 2A, the magnetic layer with perpendicular anisotropy can be implemented by providing a free layer and/or a fixed layer that includes a ferromagnetic material and nonmagnetic material. To obtain the free layer 130 and/or the fixed layer 110 with perpendicular anisotropy, a ferromagnetic material and a nonmagnetic material can be combined in a single ferromagnetic layer used in or for the free layer 130 and/or the fixed layer 110. Thus, the free layer 130 and/or the fixed layer 110 with perpendicular anisotropy can be made by combining ferromagnetic and nonmagnetic materials. Further, free layer 130 and/or the fixed layer 110 with perpendicular anisotropy can be provided by providing a free layer that includes a multilayer of magnetic and nonmagnetic layers.

In FIG. 2B, the magnetic layer with perpendicular anisotropy can be implemented by providing a free layer and/or a fixed layer that includes a ferromagnetic material and nonmagnetic material. To obtain the free layer 130' and/or the fixed layer 110' with perpendicular anisotropy, a ferromagnetic material and a nonmagnetic material can be combined in a single ferromagnetic layer used in or for the free layer 130' and/or the fixed layer 110'. Thus, the free layer 130' and/or the fixed layer 110' with perpendicular anisotropy can be made by combining ferromagnetic and nonmagnetic materials. Further, free layer 130' and/or the fixed layer 110' with perpendicular anisotropy can be provided by providing a free layer that includes a multilayer of magnetic and nonmagnetic layers.

In one implementation, a free layer 130 and/or the fixed layer 110 with perpendicular anisotropy can be provided with ferromagnetic material (Ni, Fe, Co)$_{100-y}$(Pd, Pt)$_y$, where y ranges between twenty and eighty atomic percent, or between fifty and seventy five atomic percent. Here, (Ni, Fe, Co) denotes Ni, Fe, Co, or an alloy of Ni, Fe, and/or Co. Likewise, (Pd, Pt) denotes Pd, Pt or an alloy of Pd and Pt. For example, in this implementation, free layer 130 and/or the fixed layer 110 can be comprised of Co$_{50}$Pt$_{50}$ or Co$_{50}$Pd$_{50}$. Free layer 130 and/or fixed layer 110 can include magnetic materials multilayered with nonmagnetic or oxide layers, in which the magnetic sublayers can be antiferro-magnetically or ferro-magnetically coupled.

In a second implementation, a free layer 130 and/or the fixed layer 110 with perpendicular anisotropy can be provided by combining ferromagnetic material (Ni, Fe, Co)$_{50}$(Pd, Pt)$_{50}$ with material X, where X includes at least one of Ti, Zr, Hf, V, Nb, Ta, Cr, Mo, W, Pt, Pd, Ir, Rh, Ru, Os, Re, Au, Ag, Cu. In one implementation, X ranges between zero and fifty atomic percent in content. For example, in this implementation, free layer 130 can be comprised of Co45Pd55, Co45Pd45Cu10, Co45Pd45Re10. Free layer 130 and/or fixed layer 110 can include magnetic materials multilayered with nonmagnetic or oxide layers, in which the magnetic sublayers can be antiferro-magnetically or ferro-magnetically coupled.

In a third implementation, a free layer 130 and/or the fixed layer 110 with perpendicular anisotropy can be provided by combining ferromagnetic material (Ni, Fe, Co)$_{50}$(Pd, Pt)$_{50}$ with material X, where X includes at least one of B, C, N, O, Al, Si, P, S, Ga, Ge, In, Sn, an oxide, a nitride, or a transition metal. In one implementation, X ranges between zero and fifty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a fourth implementation, a free layer 130 and/or the fixed layer 110 with perpendicular anisotropy can be provided by combining ferromagnetic material Ni, Fe, or an alloy of Ni, Fe, and/or Co including at least Ni and/or Fe with material X, where X includes at least one of Ti, Zr, Hf, V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide. In one implementation, X ranges between zero and eighty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a fifth implementation, a free layer 130 and/or the fixed layer 110 with perpendicular anisotropy can be provided by combining ferromagnetic material (Ni, Fe, Co)$_{50}$(Pd, Pt)$_{50}$ with materials X and Y; where X includes Ti, Zr, Hf, V, Nb, Ta, Cr, Mo, W, Pt, Pd, Ir, Rh, Ru, Os, Re, Au, Ag, Cu; and where Y includes at least one of B, C, N, O, Al, Si, P, S, Ga, Ge, In, Sn, an oxide, a nitride, or a transition metal silicide. In one implementation, X ranges between zero and fifty atomic percent in content. In one implementation, Y ranges between zero and fifty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a sixth implementation, a free layer 130 and/or the fixed layer 110 with perpendicular anisotropy can be provided by (Ni, Fe, Co) with materials X and Y; where X includes Cr, Ta, Nb, V, W, Hf, Ti, Zr, Pt, Pd, Gd, Tb, Dy, Ho, Nd; and where Y includes Ti, Zr, Hf; V, Nb, Ta, Cr, Mo, W, Pt, Pd, Ir, Rh, Ru, Os, Re, Au, Ag, Cu. In one implementation, X and/or Y ranges between zero and eighty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a seventh implementation, a free layer 130 and/or the fixed layer 110 with perpendicular anisotropy can be provided by (Ni, Fe, Co) with materials X and Y; where X includes Cr, Ta, Nb, V, W, Hf, Ti, Zr, Pt, Pd, Gd, Tb, Dy, Ho; and where Y includes at least one of B, C, N, O, Al, Si, P, S, Ga, Ge, In, Sn, an oxide, a nitride, or a transition metal silicide. In one implementation, X and/or Y ranges between zero and eighty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In an eighth implementation, a free layer 130 and/or the fixed layer 110 with perpendicular anisotropy can be provided by a multilayer comprised of alternating layers of magnetic material and material Y, where the layers of magnetic material include (Ni, Fe, Co) and Y includes Ni, Fe, Co, Ti, Zr, Hf, V, Nb, Ta, Cr, Mo, W, Pt, Pd, Ir, Rh, Ru, Os, Re, Au, Ag, Cu. Y can be thinner, equal, or thicker than the magnetic layers in thickness.

In a ninth implementation, a free layer 130 and/or the fixed layer 110 with perpendicular anisotropy can be provided by a multilayer comprised of alternating layers of magnetic material and material Y, where the layers of magnetic material include (Ni, Fe, Co) and Y includes at least one of Ni, Fe, Co, B, C, N, O, Al, Si, P, S, Ga, Ge, In, Sn, an oxide, a nitride, or a transition metal silicide. Y can be thinner, equal, or thicker than the magnetic layers in thickness.

In a tenth implementation, a free layer 130 and/or the fixed layer 110 with perpendicular anisotropy can be provided by a multilayer comprising of alternating layers of magnetic material and nonmagnetic material, where magnetic material layers include ferromagnetic material (Ni, Fe, Co)$_{50}$(Pd, Pt)$_{50}$ and nonmagnetic material layers include material X where X includes Cr, Pt, Pt, Pd, Ir, Rh, Ru, Os, Re, Au, Cu. The nonmagnetic material layers can be thinner, equal, or thicker than the magnetic layers in thickness.

In an eleventh implementation, a free layer 130 and/or the fixed layer 110 with perpendicular anisotropy can be provided by a multilayer comprising of alternating layers of magnetic material and nonmagnetic material, where magnetic material layers are provided by combining ferromagnetic material (Ni, Fe, Co) with material X where X includes Cr, Pt, Pd, Ir, Rh, Ru, Os, Re, Au, Cu. The nonmagnetic material layers can be thinner, equal, or thicker than the magnetic layers in thickness.

In a twelfth implementation, a free layer 130 and/or the fixed layer 110 with perpendicular anisotropy can be provided by a multilayer comprised of alternating layers of magnetic material and material Y, where the layers of magnetic material are provided by combining ferromagnetic material (Ni, Fe, Co) with material X where X includes Cr, Ta, Nb, V, W, Hf, Ti, Zr, Pt, Pd and Y includes Cr, Pt, Pt, Pd, Ir, Rh, Ru, Os, Re, Au, Cu. Y can be thinner, equal, or thicker than the magnetic layers in thickness.

In a thirteenth implementation, a free layer 130 and/or the fixed layer 110 with perpendicular anisotropy can be provided by a multilayer comprised of alternating layers of magnetic material and material Y, where the layers of magnetic material are provided by combining ferromagnetic material (Ni, Fe, Co) with material X where X includes at least one of B, C, N, O, Al, Si, P, S, Ga, Ge, In, Sn and Y includes Cr, Pt, Pt, Pd, Ir, Rh, Ru, Os, Re, Au, Cu. Y can be thinner, equal, or thicker than the magnetic layers in thickness.

In a fourteenth implementation, a free layer 130 and/or the fixed layer 110 with perpendicular anisotropy can be provided by a multilayer comprised of alternating layers of magnetic material and material Y, where the layers of magnetic material are provided by combining ferromagnetic material (Ni, Fe, Co) with material X where X includes Cr, Ta, Nb, V, W, Hf, Ti, Zr, Pt, Pd and Y includes at least one of B, C, N, O, Al, Si, P, S, Ga, Ge, In, Sn, an oxide, a nitride, or a transition metal silicide. Y can be thinner, equal, or thicker than the magnetic layers in thickness.

In a fifteenth implementations, the free layer and/or the fixed layer having perpendicular anisotropy could include material Mn, and/or including at least Ni, Al, Cr, Co, and/or Fe combined with nonmagnetic material(s). In certain implementations the nonmagnetic material(s) could include at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide.

The above implementations can be applied to the fixed layer 110' and/or the free layer 130' in FIG. 2B.

Because the current required to switch a magnetic element by the spin transfer effect depends on the difference between the anisotropy field and the demagnetization field of the free magnetic layer, introducing perpendicular anisotropy can provide the benefit of lowering the spin transfer switching current. Moreover, the control of the composition of the magnetic elements in some implementations can modify the Curie temperature and magnetic moment of the magnetic material which can achieve the benefits of lower spin transfer switching current and increased thermal stability. Further, the control of the composition of the magnetic elements in some implementations can improve the film growth, which may lead to an improved overall performance of the magnetic elements and devices.

In perpendicular magnetic elements in FIG. 2A, the free layer 130 is in direct contact with the spacer layer 120. As such, the materials for the free layer 130 and the spacer layer 120 need to be matched in their lattice structures. This restriction can limit the materials suitable for forming such structures and thus the properties of the constructed magnetic elements. For example, some perpendicular MTJ devices based on the design in FIGS. 2A and 2B use materials that exhibit an undesired high damping constant, low STT efficiency and low TMR ratio. A Low TMR ratio, in turn, causes a undesired low read speed for STT-RAM chip and a low STT efficiency causes a undesired high STT switching current.

Implementations of perpendicular magnetic elements described below include a fixed layer having a fixed layer magnetization fixed in a direction perpendicular to the fixed layer, a nonmagnetic spacer layer over the fixed layer and a free layer. In addition, one or more additional layers are included between the spacer layer and the free layer and/or between the spacer layer and the fixed layer to engineer desired properties of the magnetic elements, e.g., increasing the spin transfer efficiency and enhancing the perpendicular magnetization. Such one or more additional layers form a intermediary between the spacer layer and at least one of the free layer and the fixed layer to allow various magnetic materials to be used for either the free layer or the fixed layer to achieve desired properties of the magnetic element.

In some implementations, one or more interfacial layers can be provided to be in contact with the spacer layer. Such an interfacial layer is a thin layer of a magnetic material that exhibits a magnetization perpendicular to the interfacial layer. This interfacial layer can be sufficiently thin, e.g., under or around 1 nm, to maintain its magnetization to be perpendicular to the layers in the magnetic element via magnetic coupling with the free layer and the fixed layer.

Figure 3A:
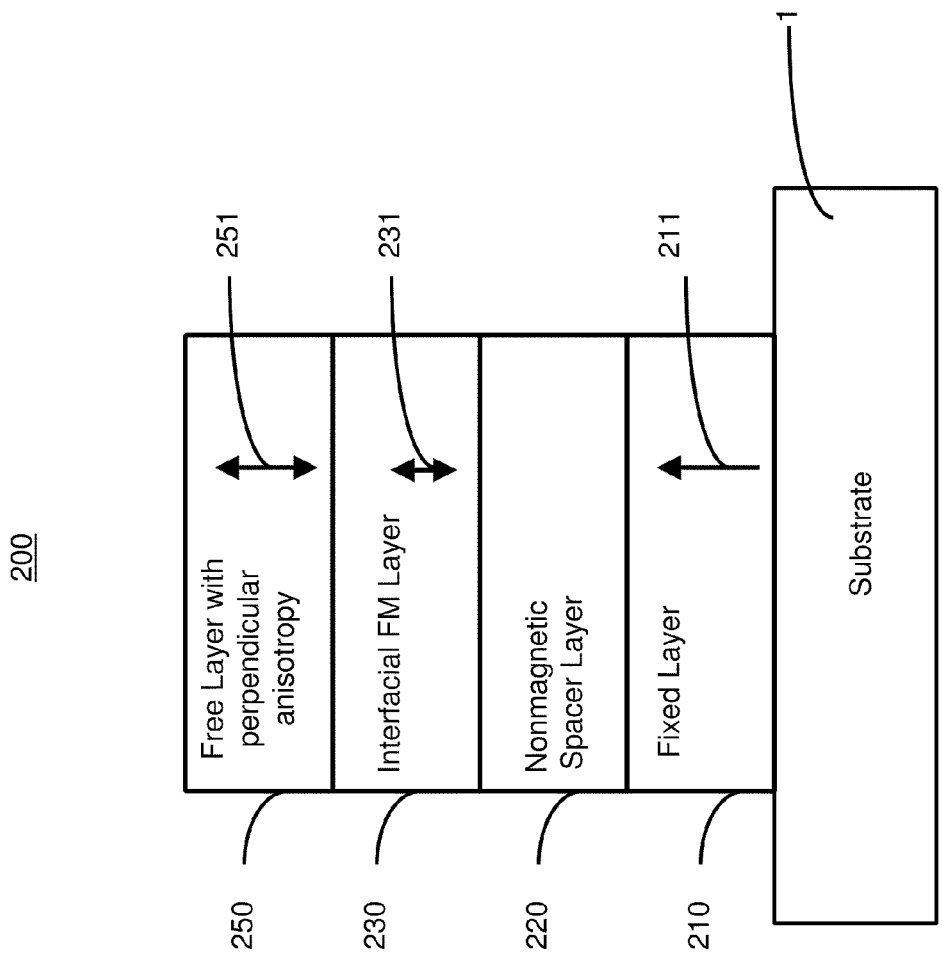
FIGS. 3A, 3B and 3C show examples of magnetic elements having a perpendicular anisotropy based on one or more interfacial layers.
Figure 3B:
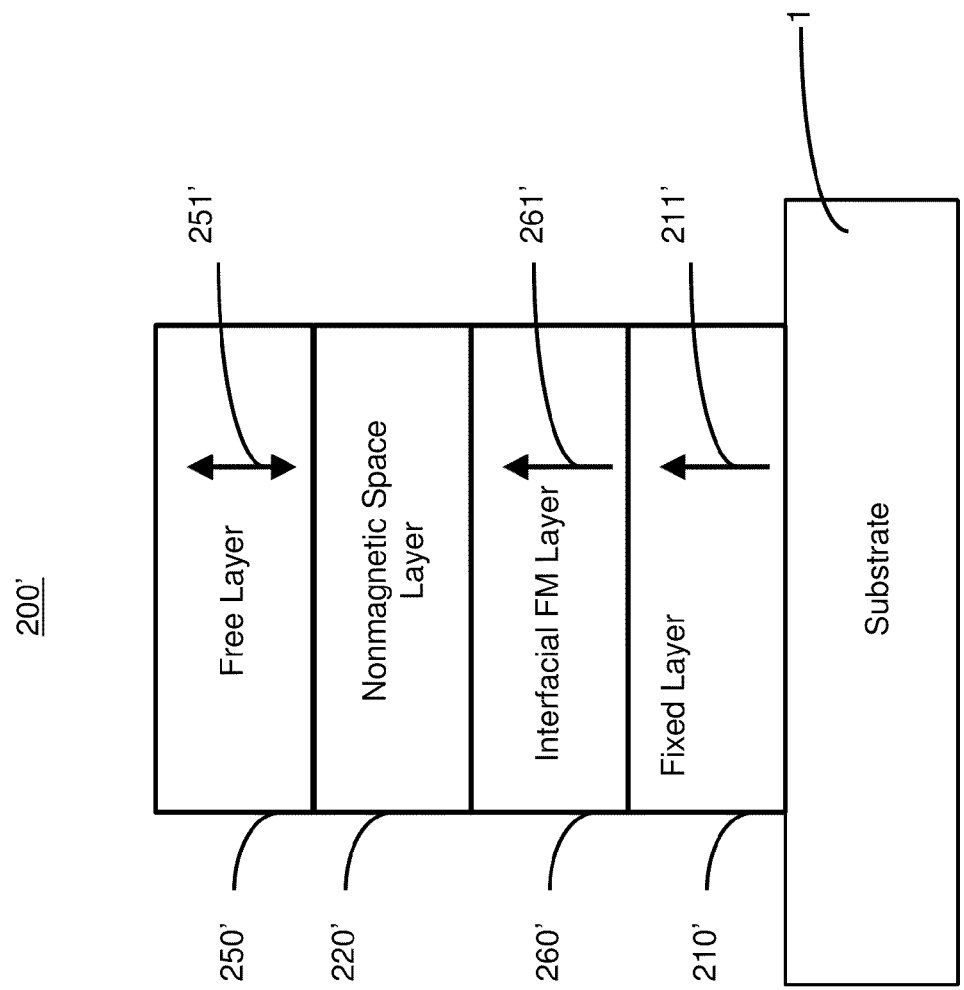
Figure 3C:
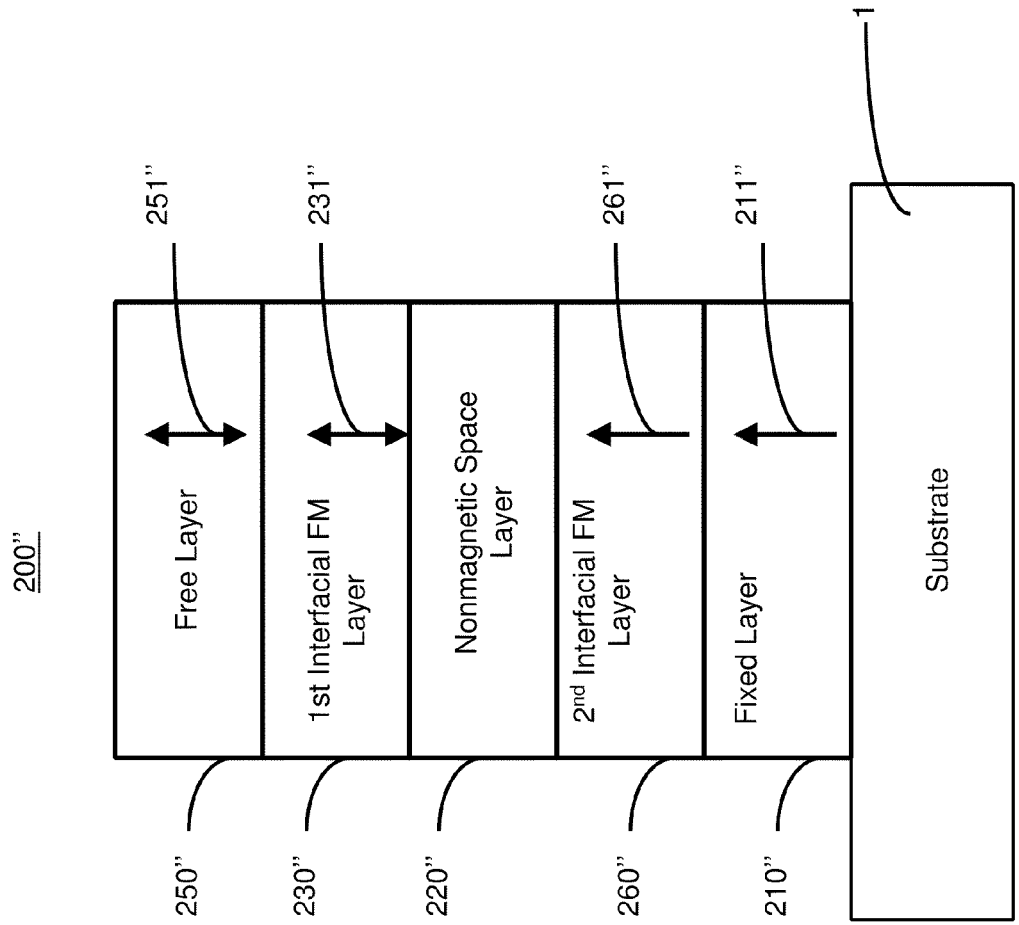

FIGS. 3A, 3B and 3C show three examples of magnetic elements with perpendicular magnetization having such additional layers. In the device 200 in FIG. 3A, the free layer is the magnetization layer 250 with a perpendicular magnetization 251 that can be switched between two perpendicular directions. The fixed layer is the magnetization layer 210 with a fixed perpendicular magnetization 211. The non-magnetic spacer layer 220 is located between the free layer 250 and the fixed layer 210. An additional magnetization layer 230, an interfacial layer, is provided between the free layer 250 and the spacer layer 220 to provide an intermediary between the free layer 250 and the spacer layer 220 and has a perpendicular magnetization 231 that is magnetically pinned to the magnetization 251 of the free layer 250 to switch with the free layer 250 based on the spin torque transfer. The thickness of the interfacial layer 230 is sufficiently thin, e.g., less than 1 nm, to allow the magnetization 231 to be strongly coupled to the magnetization 251 of the free layer 250. The presence of the interfacial layer 230 eliminates the direct contact and interface between the free layer 250 and the spacer layer 220 to allow selected magnetic materials to be used for the free layer 250.

FIG. 3B shows a different design using an interfacial magnetization layer. This device 200' includes a free layer 250' having a perpendicular magnetization 251', a spacer layer 220', an interfacial layer 260' in contact with the spacer layer 220' and having a perpendicular magnetization 261' and a fixed layer 210' with a fixed perpendicular magnetization 211'. The interfacial layer 260' is located between the spacer layer 220' and the fixed layer 210' to eliminate the direct interfacing between the fixed layer 210' and the spacer layer 220'. The magnetization 261' of the interfacial layer 260' is magnetically coupled to and pinned to the fixed magnetization 211' of the fixed layer 210'.

FIG. 3C shows an example of a device that implements two interfacial layers on opposite sides of the spacer layer to separate both the free layer and the fixed layer from being in direct contact with the spacer layer. This device 200" includes a free layer 250" having a perpendicular magnetization 251", a spacer layer 220", a first interfacial layer 230" in contact with the spacer layer 220" and having a perpendicular magnetization 231", a fixed layer 210" with a fixed perpendicular magnetization 211" and a second interfacial layer 260" with a perpendicular magnetization 261". The first interfacial layer 230" is located between the spacer layer 220" and the free layer 250" to eliminate the direct interfacing between the free layer 250" and the spacer layer 220". The magnetization 231" of the first interfacial layer 231" is magnetically coupled to the free magnetization 251" of the free layer 250" to be switched along with the free layer 250". The second interfacial layer 260" is located between the spacer layer 220" and the fixed layer 210" to eliminate the direct interfacing between the fixed layer 210" and the spacer layer 220". The magnetization 261" of the second interfacial layer 260" is magnetically coupled to and pinned to the fixed magnetization 211" of the fixed layer 210".

In other implementations, one or more film stacks of two additional adjacent layers are included between the spacer layer and the free layer and/or between the spacer layer and the fixed layer to engineer desired properties of the magnetic elements. Of the two additional adjacent layers in one film stack, the first additional layer is an interfacial layer in contact with the spacer layer. This interfacial layer is a magnetic layer with a "native" magnetization which is either perpendicular to the layer or, in absence of interaction with other layers, parallel to the interfacial layer and perpendicular to the fixed layer magnetization. In the latter case, the magnetization of the interfacial layer becomes perpendicular to the interfacial layer when it is magnetically coupled with other layers. The second additional layer is a connecting layer in contact with the interfacial layer on one side and in contact with either the free layer or the fixed layer on the other side to provide magnetic coupling between the interfacial layer with either the free layer or the fixed layer to ensure the magnetization of the interfacial layer to be perpendicular to the interfacial layer. The connecting layer is a layer that is separate from the perpendicular layer and the interfacial layer and is physically grown in between of the perpendicular layer and the interfacial layer. The thickness of the interfacial layer can be made sufficiently large (e.g., greater than 1-2 nm to achieve a large TMR ratio.

FIG. 4A shows an example of a magnetic element 300 with perpendicular magnetization having such additional layers. The free layer is the layer 250 with a perpendicular magnetization 251 that can be switched between two perpendicular and opposite directions. The fixed layer is the layer 210 with a fixed perpendicular magnetization 211. The two additional layers are magnetic layers 330 and 340 located between the free layer 250 and the spacer layer 220. The magnetic layer 330 is an interfacial layer with a sufficiently thickness to provide a high magnetization 331 and the magnetic layer 340 is a connecting layer that is in contact with the free layer 250 and the interfacial layer 330 to magnetically pull the magnetization of the interfacial layer 330 to be perpendicular to the interfacial layer 330.

The interfacial layer 330 in this example has its magnetization 331 in the plane of the interfacial layer 330 when the layer 330 is free standing and is not magnetically coupled with other layers. The connecting layer 340 has a structure to provide magnetic coupling between the free layer 250 and the interfacial layer 330 to ensure that the magnetization of the interfacial layer 330 be perpendicular to the interfacial layer 330. For example, the connecting layer 340 can be made sufficiently thin to effectuate magnetic coupling that drives the magnetization of the interfacial magnetic layer from the its original in-plane direction to the final direction perpendicular to the plane. The perpendicular magnetization of the interfacial layer 330 strengthens the overall perpendicular anisotropy of the magnetic element and thus stabilizes the free layer 251 against thermal and magnetic perturbations. The connecting layer 340 can be selected to reduce the damping of either or both of the high magnetization interfacial layer 330 and the free layer 250.

In addition, the connecting layer 340 provides a structural separation or buffer between the free layer 250 and the interfacial layer 330 to permit that the free layer 250 and the interfacial layer 330 have different material structures. This function of the connecting layer 340 provides flexibility in selecting materials for the free layer 250 and other layers to optimize enhance the properties of the final magnetic element 300. The connecting layer 340 can prevent the crystalline properties of the free layer 250 from affecting the crystallinity of the tunneling junction barrier formed by the spacer layer 220 when made of an insulating material. The present design eliminates the direct contact between the perpendicular free layer 250 and the barrier layer 220 to avoid correlation of the crystal properties of the free layer 250 and the barrier layer 220. Therefore, different crystal properties (such as lattice type) of the layers 250 and 220 can be designed to enhance the spin-torque efficiency and TMR without being limited to restrictions imposed by the compatibility of the layers 250 and 220. As an example, an epitaxial MgO (001) structure can be used as a high-quality tunneling junction barrier to improve the TMR ratio in STT device. The connecting layer 340 can also facilitate inducing the desired perpendicular anisotropy in the high-polarization interfacial layer 330, and thus assisting the perpendicular free layer 250 to pull the magnetization of the high polarization interfacial layer 330 from the in-plane direction to the perpendicular direction.

The connecting layer 340 can be made form various materials. Some examples include crystalline materials that include MgO with a resistance-area product lower than that of the spacer layer 220, such as MgO/Mn, MgO/Cr, MgO/V, MgO/Ta, MgO/Pd, MgO/Pt, MgO/Ru, and MgO/Cu. Amorphous materials may also be used to form the connecting layer 240, such as oxides SiOx, AlOx, and TiOx. Nitride materials can also be applied to form the connecting layer 240, such as TiN, TaN, CuN, SiNx. The connecting layer 240 can also be formed by a crystalline match material such as Mn, Cr, V, Ru, Cu, Pt, Pd, Au, and Ta.

The interfacial magnetic layer 330 can be configured to exhibit high spin polarization and a low damping. As an example, when the spacer layer 220 is MgO, the material for the interfacial layer 330 can be selected to create a high TMR ratio. As deposited, this interfacial layer 330 has an in-plane anisotropy and its anisotropy becomes perpendicular to the layer when the multilayer structure is formed. For example, the interfacial layer 330 can include Fe, FeCo, CoFeB and a material with a high magnetization and crystallinity match with MgO.

Figure 4B:
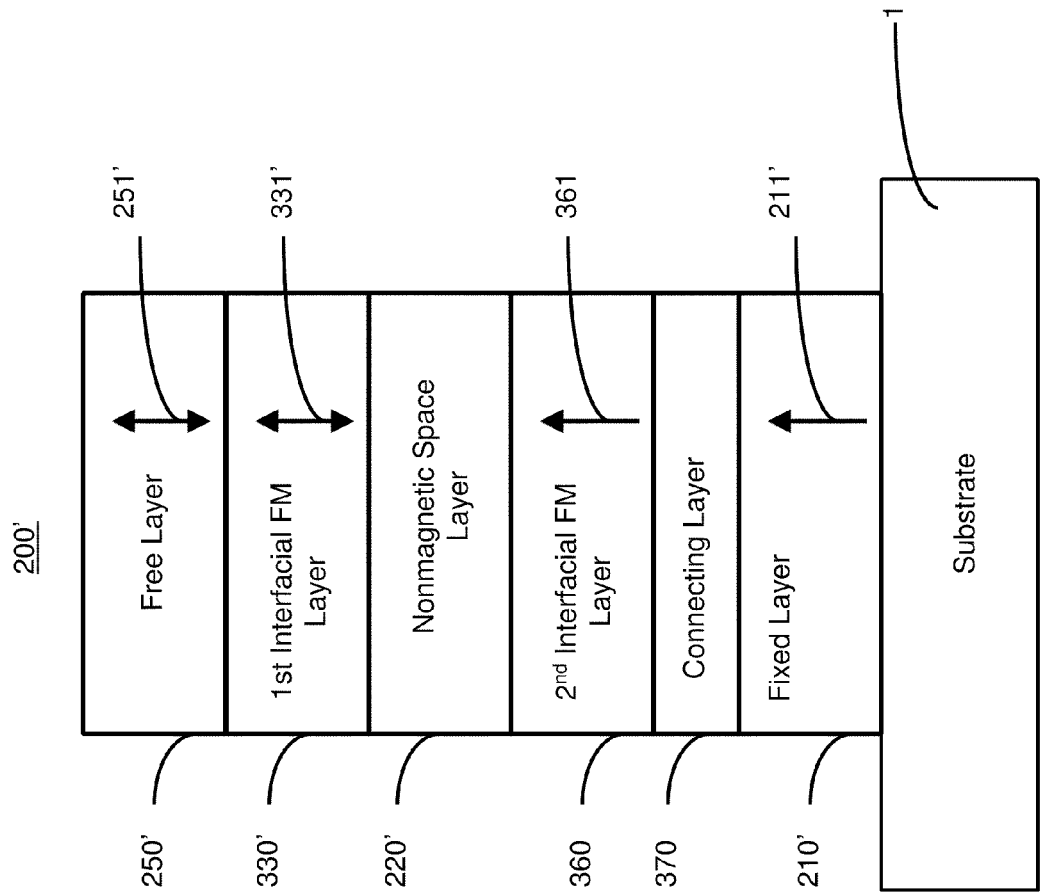

FIG. 4B shows an example of a magnetic element 300' having interfacial layers on both sides of the spacer layer. This device 300' includes a free layer 250' having a perpendicular magnetization 251', a spacer layer 220', a first interfacial layer 330' between the spacer layer 220' and the free layer 250' and having a perpendicular magnetization 331', a fixed layer 210' with a fixed perpendicular magnetization 211', a second interfacial layer 360 in contact with the spacer layer 220', and a connecting layer 370 between the second interfacial layer 360 and he fixed layer 210'. The interfacial layer 330' is located between the spacer layer 220' and the free layer 250' to eliminate the direct interfacing between the free layer 250' and the spacer layer 220'. The magnetization 331' of the interfacial layer 330' is magnetically coupled to the free magnetization 251' of the free layer 250' to switch with the free layer 250'. The connecting layer 370 magnetically couples the magnetization 361 of the interfacial layer 360 to the fixed layer 210' and thus fixes the magnetization 361. The second interfacial layer 360 and the connecting layer 370 are located between the spacer layer 220' and the fixed layer 210' to eliminate the direct interfacing between the fixed layer 210' and the spacer layer 220'.

Figure 4C:
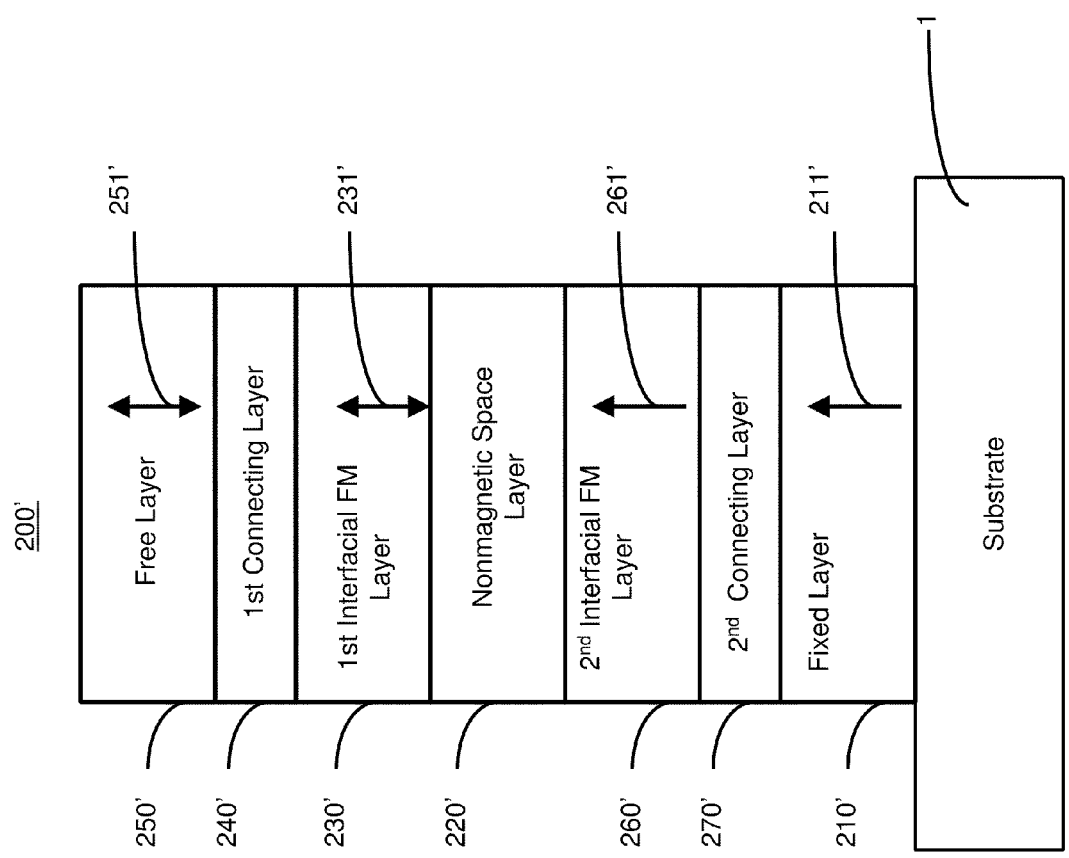

FIG. 4C shows another example of a magnetic element 300" that, in addition to having a connecting layer and an interfacial layer between the free layer and the spacer layer, implements a second connecting layer and a second interfacial layer between the fixed layer and the spacer layer. As illustrated, the magnetic element 300" includes a free layer 250' with a perpendicular magnetization 251', a nonmagnetic space layer 220' and a fixed layer 210' with a perpendicular magnetization 211'. Similar to the design in FIG. 4A, between the free layer 250' and the spacer layer 220', a first interfacial layer 330' and a first connecting layer 340' are formed. Between the fixed layer 210' and the spacer layer 220', a second interfacial layer 360 with a high polarization and a second connecting layer 370 with a resistance-area product lower than that of the spacer layer 220' for providing coupling between the second interfacial layer 260' and the fixed layer 210' are formed.

Interfacial layer and/or the connecting layer in the fixed layer and/or the free layer described above can also be applied to MTJ structures with the fixed layer above the spacer.

Figure 5:
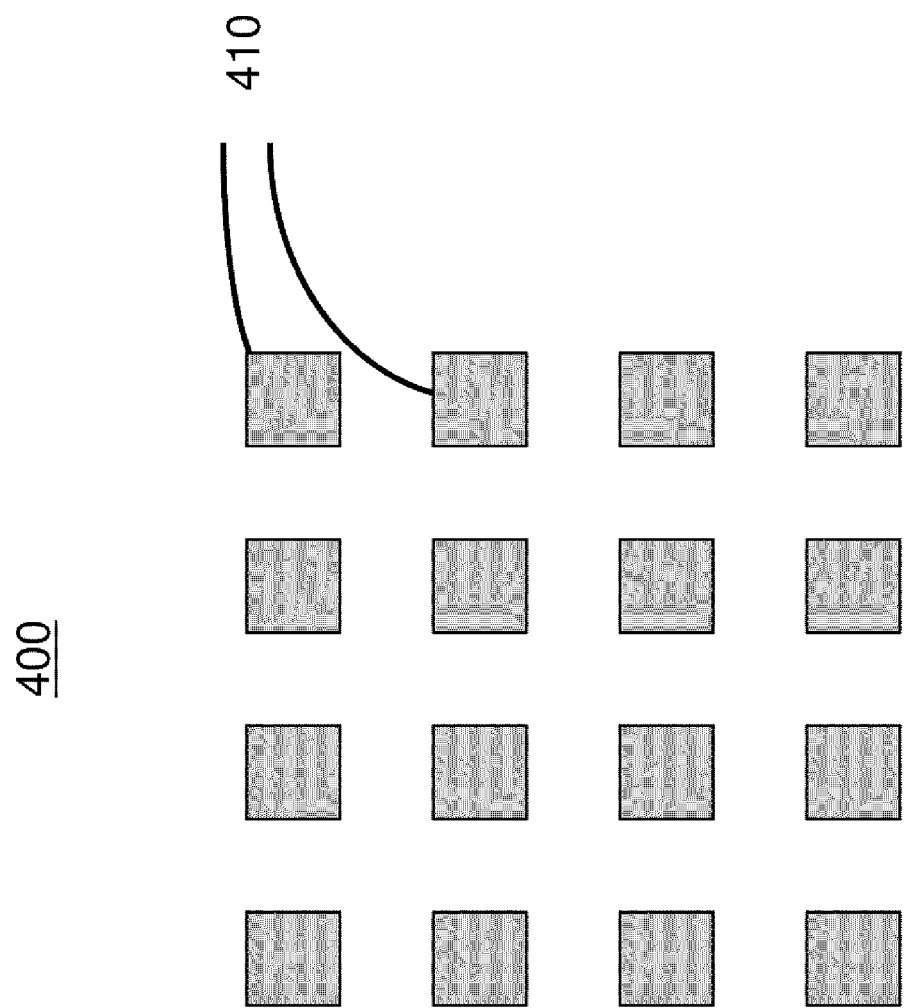
FIG. 5 depicts an example of a device of an array of magnetic elements each having a perpendicular anisotropy based on interfacial and connecting layers.

FIG. 5 shows an exemplary device 400 having an array of magnetic elements having at least one free layer having a perpendicular anisotropy. The device 400 includes an array of magnetic elements 410 that are formed on a substrate. Each magnetic element 410 can be configured to have a perpendicular anisotropy based on the designs in FIGS. 3A, 3B, 3C, 4A, 4B, and 4C described above. The device 400 also includes circuitry with isolation transistors, read and write lines, and logic circuitry for accessing individual magnetic elements 410. The device 400 can be used in magnetic memory systems.

Figure 6:
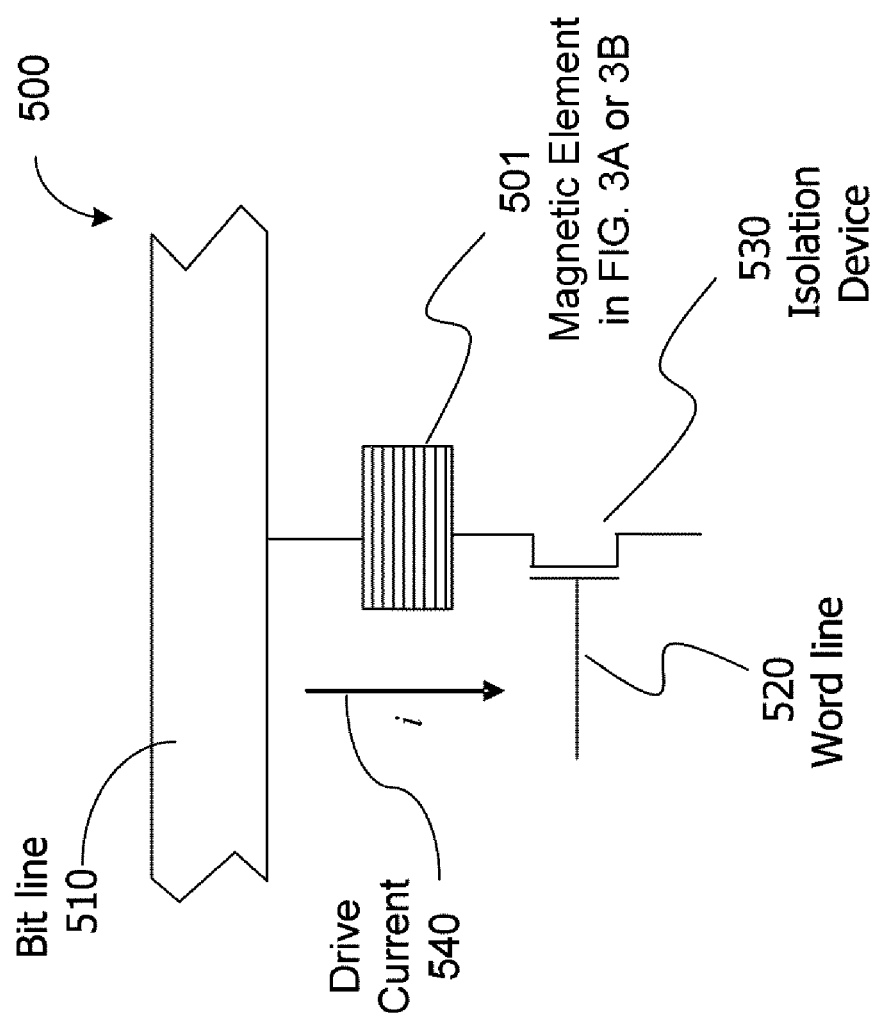
FIG. 6 depicts an example of a magnetic element having a perpendicular anisotropy free layer and/or fixed layer connected to a bit line and an isolation device.
Figure 7:
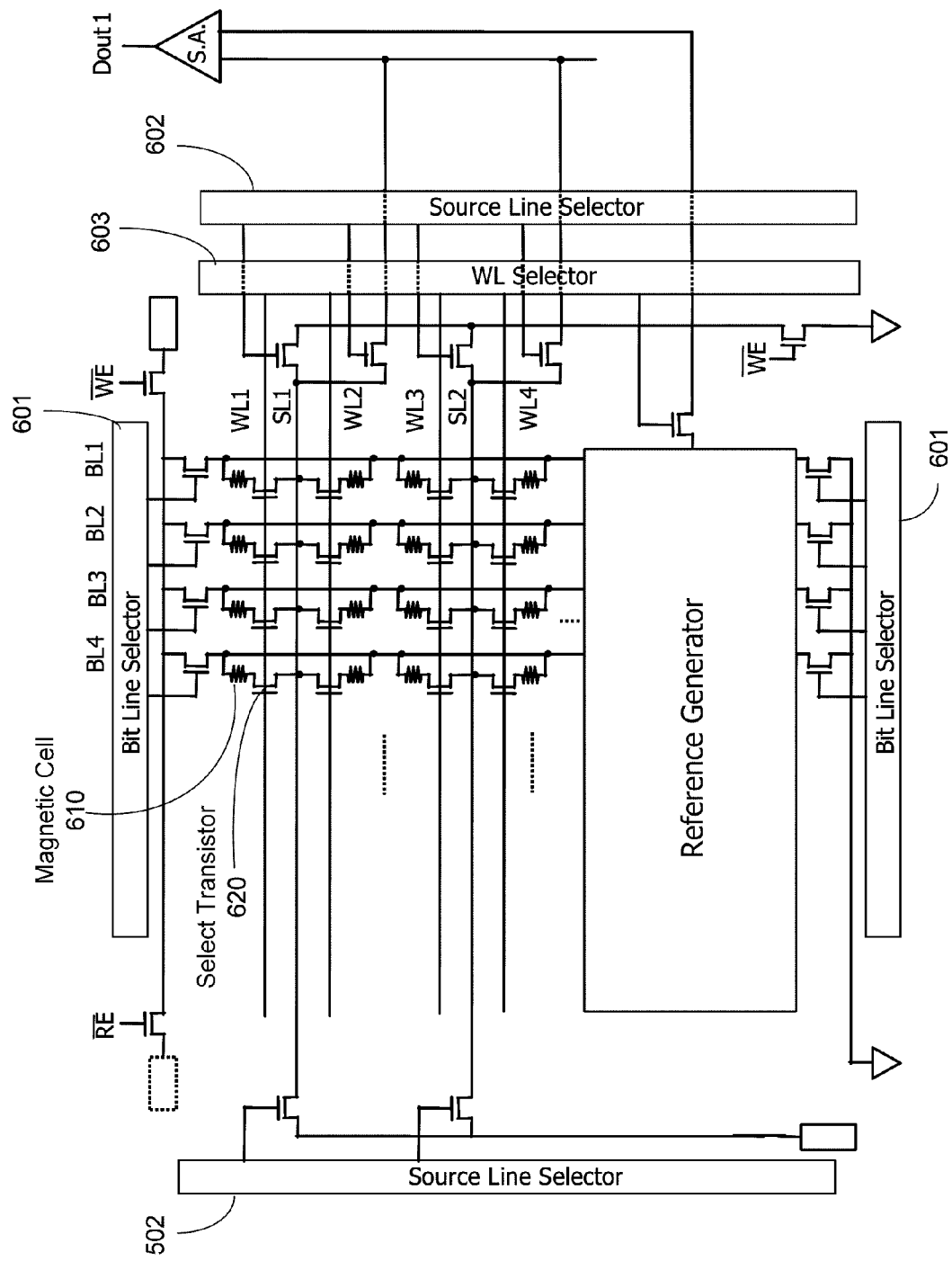
FIG. 7 depicts an exemplary implementation of the device in FIG. 6 illustrating a circuit that operates the device based on spin-transfer torque switching with a perpendicular anisotropy free layer and/or fixed layer.

The above magnetic element designs can be implemented for switching of the free layer based on the spin torque transfer. FIGS. 6 and 7 describe circuitry for switching based on the spin torque transfer.

FIG. 6 illustrates a part of an exemplary magnetic device 500 that includes an array of unit cells. Each unit cell includes a magnetic element 501 based on the spin-transfer torque effect. A conductor line 510 labeled as "bit line" is electrically coupled to the magnetic element 501 by connecting to one end of the magnetic element 501 to supply an electrical drive current 540 through the layers of the magnetic element 501 to effectuate the spin-transfer torque effect in the magnetic element 501. An electronic isolation device 530, such as an isolation transistor, is connected to one side of the magnetic element 501 to control the current 540 in response to a control signal applied to the gate of the transistor 530. A second conductor line 520 labeled as "word line" is electrically connected to the gate of the transistor 530 to supply that control signal. In operation, the drive current 540 flows across the layers in the magnetic element 501 to change magnetization direction of the free layer when the current 540 is greater than a switching threshold which is determined by materials and layer structures of the magnetic element 501. The switching of the free layer in the magnetic element 501 is based on the spin-transfer torque caused by the drive current 540 alone without relying on a magnetic field produced by the lines 510 and 520 or other sources.

The magnetic element 501 based on the spin-transfer torque effect can be implemented in various configurations, such as an MTJ, a spin valve, a combination of an MTJ and a spin valve, a combination of two MTJs and other configurations. Each of the free and pinned layers can be a single magnetic layer or a composite structure of multiple layers magnetically coupled together.

FIG. 7 shows an exemplary circuit that operates an arrayed magnetic memory device based on spin-transfer torque switching. Each cell 610 is connected in series to a select transistor 620 which corresponds to the isolation device 530 in FIG. 6. As illustrated, a bit line selector 601, a source line selector 602 and a word line selector 603 are coupled to the cell array to control the operations of each cell.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A device, comprising:
 a magnetic element including:
  a fixed layer having a fixed layer magnetization fixed in a direction perpendicular to the fixed layer;
  a nonmagnetic spacer layer over the fixed layer;
  an interfacial layer in contact with the spacer layer, the interfacial layer having a native magnetization which is, in absence of coupling with other layers, parallel to the interfacial layer and perpendicular to the fixed layer magnetization;
  a free layer over the interfacial layer, the free layer having a free layer magnetization that is perpendicular to the free layer and is changeable relative to the fixed layer magnetization; and
  a connecting layer between the interfacial layer and the free layer, the connecting layer being structured (i) to induce perpendicular anisotropy in the interfacial layer and (ii) to provide magnetic coupling between the free layer and the interfacial layer, such that (i) the induced perpendicular anisotropy together with (ii) the magnetic coupling change the magnetization of the interfacial layer from being parallel to the interfacial layer to being perpendicular to the interfacial layer.

2. The device as in claim 1, wherein:
 the connecting layer is a crystalline material that includes MgO.

3. The device as in claim 2, wherein:
 the connecting layer is structured to have a resistance-area product less than a resistance-area product of the spacer layer.

4. The device as in claim 2, wherein:
 the connecting layer is made from one of the combinations of MgO and Mn, MgO and Cr, MgO and V, MgO and Ta, MgO and Pd, MgO and Pt, MgO and Ru, or MgO and Cu.

5. The device as in claim 1, wherein:
the connecting layer is an amorphous material.

6. The device as in claim 5, wherein:
the connecting layer is made from an oxide.

7. The device as in claim 6, wherein:
the oxide is one of silicon oxide, aluminum oxide, or titanium oxide.

8. The device as in claim 5, wherein:
the connecting layer is made from a nitride.

9. The device as in claim 8, wherein:
the nitride is one of titanium nitride, tantalum nitride, copper nitride, or silicon nitride.

10. The device as in claim 1, wherein:
the connecting layer is a crystalline metal selected from the group consisting of Mn, Cr, V, Ru, Cu, Pt, Pd and Ta.

11. The device as in claim 1, wherein:
the connecting layer is a crystalline material that comprises MgO, and
the interfacial layer comprises CoFeB.

12. The device as in claim 1, wherein:
the interfacial layer comprises at least one of Fe or Co.

13. The device as in claim 1, wherein the interfacial layer has a thickness larger than 2 nanometers.

14. The device as in claim 1, wherein:
the interfacial layer comprises CoFeB.

15. The device as in claim 1, wherein:
the interfacial layer has a lattice structure that is compatible to the spacer layer.

16. The device as in claim 1, wherein between the fixed layer and the spacer layer, the magnetic element comprises:
a second interfacial layer in contact with the spacer layer, the second interfacial layer having a native magnetization which is, in absence of interaction with other layers, parallel to the second interfacial layer and perpendicular to the fixed layer magnetization; and
a second connecting layer in contact with the interfacial layer and with the fixed layer, the second connecting layer being structured (i) to induce perpendicular anisotropy in the second interfacial layer and (ii) to provide magnetic coupling between the fixed layer and the second interfacial layer, such that (i) the induced perpendicular anisotropy together with (ii) the magnetic coupling change the magnetization of the second interfacial layer from being parallel to the second interfacial layer to being perpendicular to the second interfacial layer.

17. The device of claim 1, wherein:
the free layer includes at least one ferromagnetic material Ni, Fe, Co, or combinations thereof; Pd, Pt, or combinations thereof; and combined with at least one nonmagnetic material X;
wherein the atomic percentage of free layer ferromagnetic material Ni, Fe, Co, or combinations thereof equals the atomic percentage of free layer material Pd, Pt, or combinations thereof;
wherein the free layer includes between zero and fifty atomic percent of nonmagnetic material X;
wherein X includes at least one of Ti, Zr, Hf, V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, or a transition metal silicide.

18. The device of claim 1, wherein:
the free layer includes at least one ferromagnetic material Ni, Fe, Co, or combinations thereof; Pd, Pt, or combinations thereof; and combined with at least two nonmagnetic materials $X_1$ and $X_2$;
wherein the atomic percentage of free layer ferromagnetic material Ni, Fe, Co, or combinations thereof equals the atomic percentage of free layer material Pd, Pt, or combinations thereof;
wherein the free layer includes between zero and fifty atomic percent of nonmagnetic material $X_1$;
wherein the free layer includes between zero and fifty atomic percent of nonmagnetic material $X_2$;
wherein $X_1$ includes at least one of Ti, Zr, Hf, V, Nb, Ta, Cr, Mo, W, Pt, Pd, Ir, Rh, Ru, Os, Re, Au, Ag, Cu, Gd, Tb, Dy, Ho, or Nd;
wherein $X_2$ includes at least one of B, C, N, O, Al, Si, P, S, Ga, Ge, In, Sn, or a transition metal silicide.

19. The device as in claim 1, comprising:
a circuit that is coupled to the magnetic element and supplies a current to flow through layers of the magnetic element in a direction perpendicular to the layers to switch the magnetization of the free layer.

20. The device as in claim 1, comprising:
a substrate on which the magnetic element is formed to place the fixed layer between the free layer and the substrate.

21. The device as in claim 1, comprising:
a substrate on which the magnetic element is formed to place the free layer between the fixed layer and the substrate.

22. A device, comprising:
a magnetic element array including:
a substrate; and
a plurality of magnetic elements formed on the substrate, each magnetic element comprising
a fixed layer having a fixed layer magnetization fixed in a direction perpendicular to the fixed layer,
a nonmagnetic spacer layer over the fixed layer,
an interfacial layer in contact with the spacer layer, the interfacial layer having a native magnetization which is, in absence of coupling with other layers, parallel to the interfacial layer and perpendicular to the fixed layer magnetization,
a free layer over the interfacial layer, the free layer having a free layer magnetization that is perpendicular to the free layer and is changeable relative to the fixed layer magnetization based on spin torque transfer, and
a connecting layer between the interfacial layer and the free layer, the connecting layer being structured (i) to induce perpendicular anisotropy in the interfacial layer and (ii) to provide magnetic coupling between the free layer and the interfacial layer, such that (i) the induced perpendicular anisotropy together with (ii) the magnetic coupling change the magnetization of the interfacial layer from being parallel to the interfacial layer to being perpendicular to the interfacial layer; and
a circuit that is coupled to the magnetic element array and supplies a current to flow through layers of each magnetic element in a direction perpendicular to the layers to switch the magnetization of the free layer based on spin torque transfer between two magnetization directions.

23. The device as in claim 22, wherein:
the connecting layer is a crystalline material that includes MgO.

24. The device as in claim 23, wherein:
the connecting layer is structured to have a resistance-area product less than a resistance-area product of the spacer layer.

25. The device as in claim 23, wherein:
the connecting layer is made from one combination of MgO and Mn, MgO and Cr, MgO and V, MgO and Ta, MgO and Pd, MgO and Pt, MgO and Ru, or MgO and Cu.

26. The device as in claim 22, wherein:
the connecting layer is an amorphous material.

27. The device as in claim 26, wherein:
the connecting layer is made from an oxide.

28. The device as in claim 27, wherein:
the oxide is one of silicon oxide, aluminum oxide, or titanium oxide.

29. The device as in claim 26, wherein:
the connecting layer is made from a nitride.

30. The device as in claim 29, wherein:
the nitride is one of titanium nitride, tantalum nitride, copper nitride, or silicon nitride.

31. The device as in claim 22, wherein:
the connecting layer is a crystalline metal selected from the group consisting of Mn, Cr, V, Ru, Cu, Pt, Pd and Ta.

32. The device as in claim 22, wherein:
the connecting layer is a crystalline material that comprises MgO, and
the interfacial layer comprises CoFeB.

33. The device as in claim 22, wherein:
the interfacial layer comprises at least one of Fe and Co.

34. The device as in claim 22, wherein the interfacial layer comprises FeCoB.

35. The device as in claim 22, wherein the interfacial layer has a thickness larger than 2 nanometers.

36. The device as in claim 22, wherein:
the free layer includes at least one ferromagnetic material Ni, Fe, Co, or combinations thereof; Pd, Pt, or combinations thereof; and combined with at least one nonmagnetic material X;
wherein the atomic percentage of free layer ferromagnetic material Ni, Fe, Co, or combinations thereof equals the atomic percentage of free layer material Pd, Pt, or combinations thereof;
wherein the free layer includes between zero and fifty atomic percent of nonmagnetic material X; and
wherein X includes at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, or a transition metal silicide.

37. The device of claim 22, wherein:
the free layer includes at least one ferromagnetic material Ni, Fe, Co, or combinations thereof; Pd, Pt, or combinations thereof; and combined with at least two nonmagnetic materials $X_1$ and $X_2$;
wherein the atomic percentage of free layer ferromagnetic material Ni, Fe, Co, or combinations thereof equals the atomic percentage of free layer material Pd, Pt, or combinations thereof;
wherein the free layer includes between zero and fifty atomic percent of nonmagnetic material $X_1$;
wherein the free layer includes between zero and fifty atomic percent of nonmagnetic material $X_2$;
wherein $X_1$ includes at least one of Ti, Zr, Hf, V, Nb, Ta, Cr, Mo, W, Pt, Pd, Ir, Rh, Ru, Os, Re, Au, Ag, Cu, Gd, Tb, Dy, Ho, or Nd; and
wherein $X_2$ includes at least one of B, C, N, O, Al, Si, P, S, Ga, Ge, In, Sn, or a transition metal silicide.

38. A device, comprising:
a magnetic element including:
a fixed layer having a fixed layer magnetization fixed in a direction perpendicular to the fixed layer;
a nonmagnetic spacer layer over the fixed layer;
an interfacial layer in contact with the spacer layer, the interfacial layer comprising CoFeB with a native magnetization which is, in absence of coupling with other layers, parallel to the interfacial layer and perpendicular to the fixed layer magnetization;
a free layer over the interfacial layer, the free layer having a free layer magnetization that is perpendicular to the free layer and is changeable relative to the fixed layer magnetization; and
a connecting layer between the interfacial layer and the free layer, the connecting layer being a crystalline material that includes MgO which induces perpendicular anisotropy in the interfacial layer, such that the magnetization of the interfacial layer having the induced perpendicular anisotropy changes, via magnetic coupling with the free layer, from being parallel to the interfacial layer to being perpendicular to the interfacial layer.

39. The device as in claim 38, wherein the interfacial layer has a thickness larger than 2 nanometers.

40. The device as in claim 39, wherein the free layer has a thickness larger than the thickness of the interfacial layer.

41. The device as in claim 38, wherein the free layer has a thickness larger than the thickness of the interfacial layer.

42. The device of claim 38, wherein:
the free layer includes at least one ferromagnetic material Ni, Fe, Co, or combinations thereof; Pd, Pt, or combinations thereof; and combined with at least one nonmagnetic material X;
wherein the atomic percentage of free layer ferromagnetic material Ni, Fe, Co, or combinations thereof equals the atomic percentage of free layer material Pd, Pt, or combinations thereof;
wherein the free layer includes between zero and fifty atomic percent of nonmagnetic material X; and
wherein X includes at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, or a transition metal silicide.

43. The device of claim 38, wherein:
the free layer includes at least one ferromagnetic material Ni, Fe, Co, or combinations thereof; Pd, Pt, or combinations thereof; and combined with at least two nonmagnetic materials X1 and X2;
wherein the atomic percentage of free layer ferromagnetic material Ni, Fe, Co, or combinations thereof equals the atomic percentage of free layer material Pd, Pt, or combinations thereof;
wherein the free layer includes between zero and fifty atomic percent of nonmagnetic material X1;
wherein the free layer includes between zero and fifty atomic percent of nonmagnetic material X2;
wherein X1 includes at least one of Ti, Zr, Hf, V, Nb, Ta, Cr, Mo, W, Pt, Pd, Ir, Rh, Ru, Os, Re, Au, Ag, Cu, Gd, Tb, Dy, Ho, or Nd; and
wherein X2 includes at least one of B, C, N, O, Al, Si, P, S, Ga, Ge, In, Sn, or a transition metal silicide.

44. The device as in claim 38, further comprising:
a circuit that is coupled to the magnetic element and supplies a current to flow through layers of the magnetic element in a direction perpendicular to the layers to switch the magnetization of the free layer.

45. The device as in claim 38, comprising:
a substrate on which the magnetic element is formed to place the fixed layer between the free layer and the substrate.

46. The device as in claim 38, comprising:
a substrate on which the magnetic element is formed to place the free layer between the fixed layer and the substrate.

* * * * *

UNITED STATES PATENT AND TRADEMARK OFFICE
CERTIFICATE OF CORRECTION

PATENT NO. : 8,072,800 B2  
APPLICATION NO. : 12/560362  
DATED : December 6, 2011  
INVENTOR(S) : Eugene Youjun Chen and Shengyuan Wang Page 1 of 1

It is certified that error appears in the above-identified patent and that said Letters Patent is hereby corrected as shown below:

In the specification

Column 1, lines 6-7

Please insert the following paragraph before the first paragraph:

--GOVERNMENT RIGHTS  
This invention was made with U.S. Government support under Grant/Contract No.  
H R0011-09-C-0023 awarded by DARPA. The U.S. Government retains certain rights in this invention. Distribution authorized to U.S. Government Agencies only.--

Signed and Sealed this  
Sixteenth Day of February, 2016

Michelle K. Lee  
*Director of the United States Patent and Trademark Office*